(12) United States Patent
Shibagaki et al.

(10) Patent No.: US 8,198,182 B2
(45) Date of Patent: Jun. 12, 2012

(54) ANNEALING METHOD FOR SEMICONDUCTOR DEVICE WITH SILICON CARBIDE SUBSTRATE AND SEMICONDUCTOR DEVICE

(75) Inventors: Masami Shibagaki, Tokyo (JP); Akihiro Egami, Kawasaki (JP)

(73) Assignee: Canon Anelva Corporation, Kawasaki-Shi (JP)

(*) Notice: Subject to any disclaimer, the term of this patent is extended or adjusted under 35 U.S.C. 154(b) by 0 days.

(21) Appl. No.: 13/009,373

(22) Filed: Jan. 19, 2011

(65) Prior Publication Data

US 2011/0121317 A1 May 26, 2011

Related U.S. Application Data

(63) Continuation of application No. 11/813,621, filed as application No. PCT/JP2007/059132 on Apr. 20, 2007, now abandoned.

(51) Int. Cl.
*H01L 21/265* (2006.01)
(52) U.S. Cl. .................. 438/522; 438/530; 438/514
(58) Field of Classification Search .............. 438/22, 438/514, 522, 530
See application file for complete search history.

(56) References Cited

U.S. PATENT DOCUMENTS

2003/0020136 A1* 1/2003 Kitabatake et al. ........... 257/502

FOREIGN PATENT DOCUMENTS

| JP | 2002-75909 | 3/2002 |
|---|---|---|
| JP | 2002-93742 | 3/2002 |
| JP | 2004-311696 | 11/2004 |
| JP | 2005-116896 A | 4/2005 |
| WO | WO 2006/043530 A1 | 4/2006 |

OTHER PUBLICATIONS

Masami et al., Development of the Novel Electron Bombardment Anneal System (EBAS) for SiC Post Ion Implantation Anneal, Material Science Forums vols. 483-485 (2005) pp. 609-612, 2005.*
Kuroda, N. et al., "Step-Controlled VPE Growth of SiC Single Crystals at Low Temperatures", *Extended Abstracts of the 19th Conference on Solid State Devices and Materials*, Tokyo, pp. 227-230 (1987).
Egami, A., et al., "Evaluation of Correlation Between Annealing Ambient and the Surface Roughening of $N^+$ Implanted 4H-SiC EBAS Annealing", *Proceedings of the 25th Symposium on Materials Science and Engineering, Research Center of Ion Beam Technology*, Dec. 8, 2006, pp. 33-36.
Shibagaki, M., et al., "Impact of EBAS Annealing on Sheet Resistance Reduction for AL-Implanted 4H-SiC (0001)", *Materials Research Soc.*, vol. 911 (2006) (0911-B11-02), 5 pages.
Negoro, Y., et al., "Technological Aspects of Ion Implantation in SiC4 Device Processes", *Materials Science Forum*, vols. 483-485 (2005), pp. 599-604.

(Continued)

*Primary Examiner* — Samuel Gebremariam
(74) *Attorney, Agent, or Firm* — Fitzpatrick, Cella, Harper & Scinto (57) ABSTRACT

In an atmosphere in which a silicon carbide (SiC) substrate implanted with impurities is annealed to activate the impurities, by setting a partial pressure of $H_2O$ to be not larger than $10^{-2}$ Pa, preferably not larger than $10^{-3}$ Pa, surface irregularity of the silicon carbide (SiC) substrate is controlled to be not greater than 2 nm, more preferably not greater than 1 nm in RMS value.

6 Claims, 12 Drawing Sheets

OTHER PUBLICATIONS

Capano, M.A., et al., "Surface Roughening in Ion Implanted 4H-Silicon Carbide", *Journal of Electronic Materials*, vol. 28, No. 3, 1999, pp. 214-218.

Handy, E., et al., "Effectiveness of AlN Encapsulant in Annealing Ion-implanted SiC", *Journal of Applied Physics*, vol. 86, No. 2, Jul. 15, 1999, pp. 746-751.

Krishnaswami, S., et al., "Reliability of High Voltage 4H-SiC MOSFET Devices", *Materials Research Soc.*, vol. 911, 2006, 6 pages.

Kimoto, T., et al., "Nitrogen Ion Implantation into α-SiC Epitaxial Layers", *Phys. Stat. Sol.* (a) 162, 263 (1997), pp. 263-276.

\* cited by examiner

PROCESS FLOW OF SiC-DMOSFET

ANNEALING METHOD FOR SEMICONDUCTOR DEVICE WITH SILICON CARBIDE SUBSTRATE AND SEMICONDUCTOR DEVICE

CROSS-REFERENCE TO RELATED APPLICATIONS

This application is a continuation of U.S. application Ser. No. 11/813,621, filed on Jul. 10, 2007, now abandoned which is a national-stage entry of International Application No. PCT/JP2007/059132, filed on Apr. 20, 2007. The entire disclosures of these earlier applications are hereby incorporated by reference herein.

TECHNICAL FIELD

The present invention relates to an annealing method for activating an ion implanted region in a device including a silicon carbide (SiC) substrate having an ion implanted layer formed therein and a semiconductor device.

BACKGROUND ART

When a semiconductor device such as a MOSFET (MOS Field-Effect Transistor) is manufactured, impurity control of a semiconductor substrate is necessary. For impurity control in using a silicon carbide (SiC) substrate, a combination of ion implantation and activation annealing process generally is used, because a diffusion rate of impurity is very small. (Phys. Stat. Sol. (a) Vol. 162 (1997), p, 263, T. Kimoto, N. Inoue and H. Matsunami). For the impurity control of a silicon carbide (SiC) semiconductor device, ions to provide impurities are implanted into a required part of the silicon carbide (SiC) substrate by an ion implantation system. Next, the silicon carbide (SiC) substrate is annealed to activate impurities using a high temperature annealing apparatus such as a high frequency induction heating apparatus. (See Japanese Patent Application Laid-Open No. 2004-311696)

SUMMARY OF THE INVENTION

However, when annealing is performed to activate impurities in a silicon carbide (SiC) substrate, surface irregularity having a surface flatness of about 6.0 nm (RMS value) is generated, and it is observed that reliability of a gate insulating film and channel mobility were lowered in such semiconductor device. Therefore, the present invention aims to solve the problems described above, and to provide an annealing method for annealing a device including a silicon carbide (SiC) substrate so that the surface flatness (RMS value) is controlled to be not greater than 6.0 nm, and further to provide a semiconductor device in which a high, electric activation can be accomplished while maintaining the surface flatness (RMS value) to be not greater than 2 nm, and preferably not greater than 1 nm by using this annealing method.

An annealing method for annealing a device including a silicon carbide (SiC) substrate according to the present invention includes a step of forming an impurity doped region in a silicon carbide (SiC) substrate and a step of annealing the impurity doped region in the silicon carbide (SiC) substrate, and it is specified that a partial pressure of $H_2O$ in an annealing atmosphere in the annealing step is not larger than $10^{-2}$ Pa.

In one embodiment, the silicon carbide (SiC) substrate has an epitaxial silicon carbide (SiC) crystalline layer as a surface layer, and an impurity doped region is formed in the silicon carbide (SiC) crystalline layer.

It is more preferable that an atmosphere for the annealing step has a partial pressure of $H_2O$ not larger than $10^{-3}$ Pa. In the annealing step, the silicon carbide (SiC) substrate implanted with impurities is preferably annealed with being covered by a cap.

The annealing step is carried out in a vacuum vessel capable of evacuating of air, and in one embodiment, the vacuum vessel is evacuated of air so that a pressure in the vacuum vessel is not greater than $10^{-4}$ Pa. There is provided a semiconductor device including a silicon carbide (SiC) substrate and an impurity doped region in the substrate, in which a surface flatness of the silicon carbide (SiC) substrate is not greater than 2 nm, and more preferably not greater than 1 nm in RMS value, and in one embodiment, the semiconductor device is a MOS field-effect transistor.

An annealing method for activating a device including a silicon carbide (SiC) substrate according to the present invention sets a partial pressure of residual $H_2O$ in a vacuum vessel to be not larger than $10^{-2}$ Pa, and anneals, and whereby, an advantage is provided that a surface flatness of the silicon carbide (SiC) substrate can be controlled to be equal to or less than 2 nm (RMS value). Further, by setting the partial pressure of residual $H_2O$ in the vacuum vessel to be not larger than $10^{-3}$ Pa and annealing, an advantage is provided that a semiconductor device can be provided in which a high, electric activation can be easily accomplished while maintaining the surface flatness to be equal to or less than 1 nm (RMS value).

EMBODIMENTS

FIGS. 1A to 1F are process drawings illustrating steps of an annealing method for activating a device including a silicon carbide (SiC) substrate implanted with aluminum as atoms for impurity ions. Generally, because the quality of a monocrystal silicon carbide (SiC) substrate is yet questionable, an epitaxial growth is conducted on a surface of the monocrystal SiC substrate in an SiC epitaxial growth furnace, and subsequently, in this SiC epitaxial layer, a device is formed. Because silicon carbide (SiC) has a plurality of crystalline types such as 3C, 4H and 6H, a silicon carbide (SiC) substrate of which crystalline orientation is offset relative to a surface of the C axis by 4° or 8° is used in order to conduct a homoepitaxial growth with a uniform crystalline orientation. (step flow growth: Ext. Abst. 19th Conf. Solid State Devices and Materials (Tokyo, 1987) 227, N. Kuroda, K. Shibahara, W. S. Yoo, S. Nishino and H. Matsunami) A step of growing an SiC epitaxial layer 2 on a monocrystal silicon carbide (SiC) substrate 1 shown in FIG. 1A will be described. A surface of the monocrystal SiC substrate is etched at a temperature of about 1300° C. using HCl (flow rate: 1 mL/min.), and a damaged layer is removed. Next, an epitaxial layer of silicon carbide (SiC) is grown (growth rate: 3 m/hour) at a temperature of about 1500° C. using an $SiH_4$ gas (50 sccm, 1.0% $H_2$ dilution) and a $C_3H_8$ gas (33 sccm, 1.0% $H_2$ dilution) as raw material gases, and an $H_2$ gas (flow rate: 3 sLm) as a carrier gas. At this time, with flowing a nitrogen gas (6 sccm contained in 0.5% $H_2$) as a doping gas, an n-type epitaxial layer is formed. According to the step described above, an epitaxial layer 2 of silicon carbide (SiC) (film thickness: 10 μm) is formed on the monocrystal silicon carbide (SiC) substrate 1. In addition, the monocrystal silicon carbide (SiC) substrate and also the entire structure in which the epitaxial SiC layer is formed on the monocrystal substrate shown in FIG. 1A may be herein called the "silicon carbide (SiC) substrate" collectively.

Figure 2:
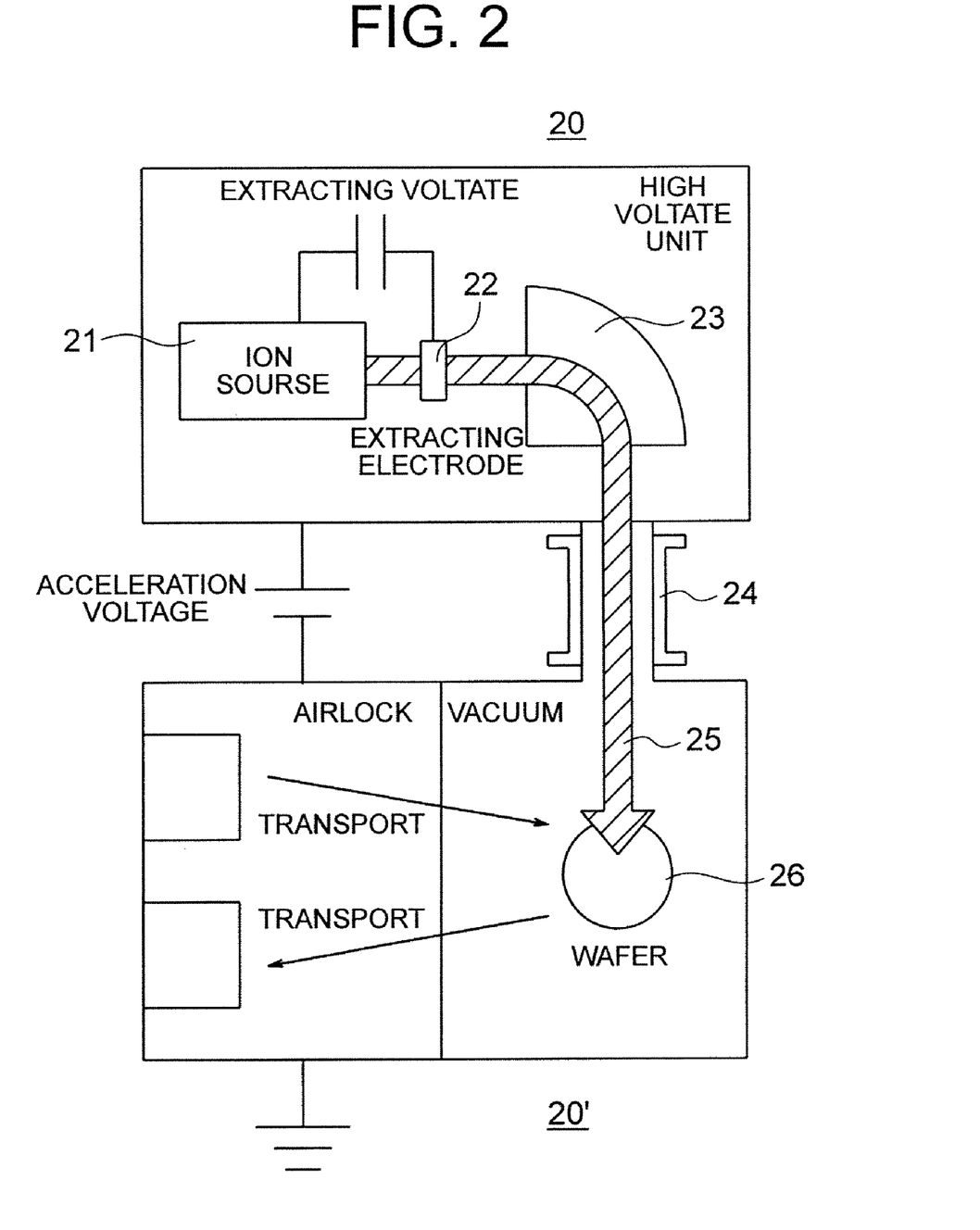
FIG. 2 schematically shows an ion implantation system.

FIG. 2 shows an ion implantation system for selectively forming a well region or a contact region for manufacturing a device on a SiC substrate. Operation of the ion implantation system used in the present invention is as follows. Impurity material desired to implant is ionized using a filament or plasma in an ion source 21 in an ion gun 20. Plasma (excited ion species) is extracted in a form of beam using an extraction electrode 22. Only impurity ions desired to implant are extracted using an analyzing magnet 23 or an analyzer tube. Implantation energy is determined by an accelerating voltage between the ion source 21 and an end station 201 at an accelerating tube 24. (The implantation energy determines an implantation depth). A beam 25 is scanned in order to uniformly implant the ions in a surface of a wafer 26 having a mask in which an ion inflow region is exposed. In the end station 201, the wafer 26 may be rotated to improve uniformity, and it may be also heated to a high temperature to maintain crystallization.

An implantation process for implanting impurities into a SiC substrate used in the present invention is as follows. After a substrate with 4H—SiC (0001) offset by 4° having an SiC epitaxial layer is oxidized for 30 minutes at 1150° C. in a thermal oxidation furnace, a hydrofluoric acid treatment is performed to make a surface clean. A through oxide film having a thickness of 10 nm is formed again in the thermal oxidation furnace in order to prevent contamination. It is implanted with impurities in the ion implantation system shown in FIG. 2. An SiC substrate sample 26 is placed in the end station 201. Implantation may be performed at room temperature, but from the viewpoint of maintaining crystallization, the sample temperature may be heated to 300° C. to 800° C. For the impurities, TMA (tetramethyl aluminum) as a source is excited by plasma to extract Al ions to implant using the extraction electrode 22 and the analyzing magnet 23. An implantation depth is controlled by extraction energy between the ion source 21 and the end station 201, and an amount of implantation is controlled by a quantity of ion current. (A combination of the energy and the quantity of current is called the "implantation schedule", and this controls an implantation profile). The SiC substrate sample 26 implanted is treated by means of the hydrofluoric acid treatment to remove the through oxide film, and subsequently, it is annealed for activation.

Figure 1A:
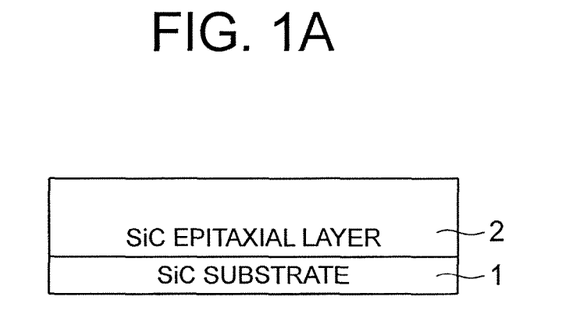
FIG. 1A shows a silicon carbide (SiC) substrate having an epitaxial SiC layer.
Figure 1B:
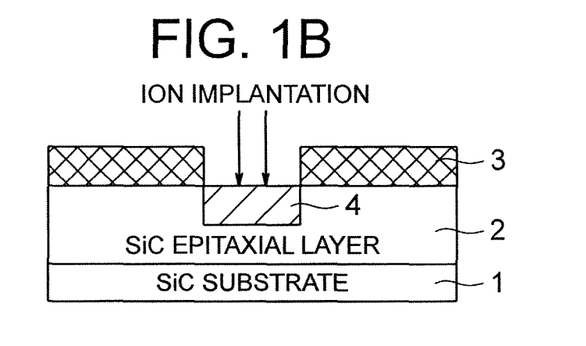
FIG. 1B shows impurity implantation into the silicon carbide (SiC) substrate shown in FIG. 1A.

According to the process described above, an ion implanted region 4 is formed in a manner that the Al impurities are implanted into the SiC epitaxial layer 2 as shown in FIG. 1B. That is, after sacrifice oxidation and the hydrofluoric acid treatment, a mask 3 of $SiO_2$ etc. is formed on the epitaxial layer of silicon carbide (SiC), and the aluminum ions to be impurities are implanted into the epitaxial layer 2 of silicon carbide (SiC) by the ion implantation system shown in FIG. 2 etc. to selectively form the impurity implanted region 4 (a well region or a contact region). In addition, in this embodiment, an example in which, for the impurities, TMA (tetramethyl aluminum) as a source is excited by plasma to extract Al ions to implant using the extraction electrode and the analyzer tube is described, alternatively, an aluminum target as a source may be excited by plasma to extract aluminum ions to implant using the extraction electrode and the analyzer tube.

Figure 3:
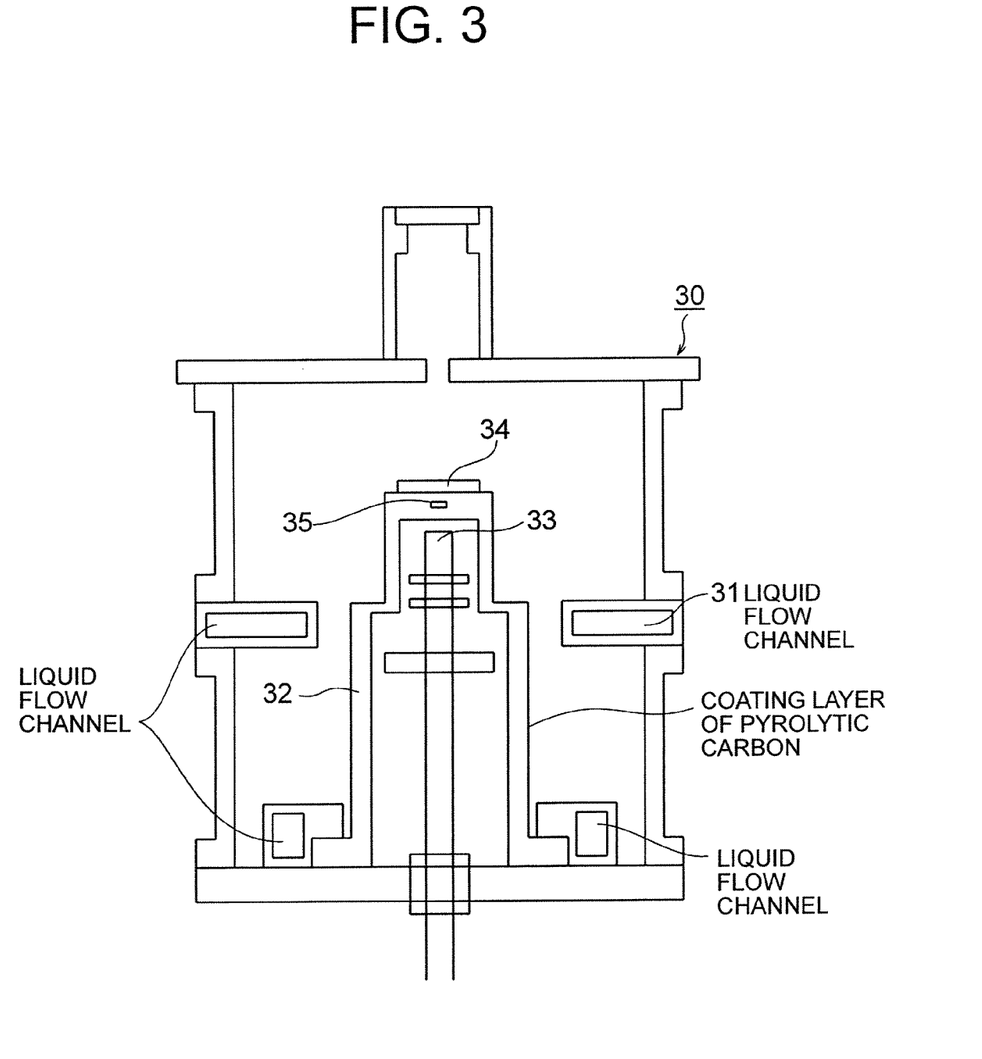
FIG. 3 is a cross-section view of a heating apparatus for annealing.

FIG. 3 is a cross-section view of a heat treatment apparatus for annealing. A heat treatment chamber 30 is formed of aluminum with the reflectance of an inner wall thereof being enhanced by a mirror finish, and it is a water-cooled aluminum chamber configured so that a cooling fluid can flow in a liquid flow channel 31. This heat treatment chamber 31 can be evacuated of air to a vacuum of about $10^{-2}$ Pa, and also in an atmospheric state, a heat treatment can be conducted. Heating means 33 is included in a susceptor 32, and a silicon carbide (SiC) substrate 34 to be subjected to a heat treatment is placed on the upper side of a substrate support on the upper side in FIG. 3 of the susceptor 32. On the susceptor support on which upper surface the silicon carbide (SiC) substrate 34 is placed is provided with a sensor 35 as shown in FIG. 3 for detecting a heating temperature. As the heating means 33, thermal electron generating means for heating for electron impact is shown in FIG. 3, but in addition to it, an infrared lamp for heating an infrared lamp or a high frequency induction coil for high frequency induction heating etc. may be used. The inside of the susceptor 32 can be evacuated of air by evacuation means, such as a vacuum pump, provided separately from the one for the heat treatment chamber so that a vacuum is always maintained to be not greater than about $10^{-2}$ Pa.

Figure 1C:
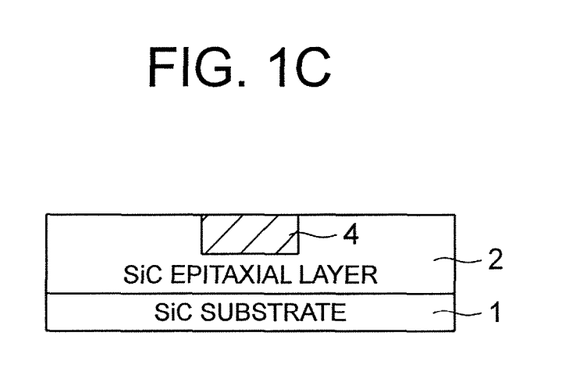
FIG. 1C shows annealing of the silicon carbide (SiC) substrate implanted with impurities in FIG. 1B.
Figure 1D:
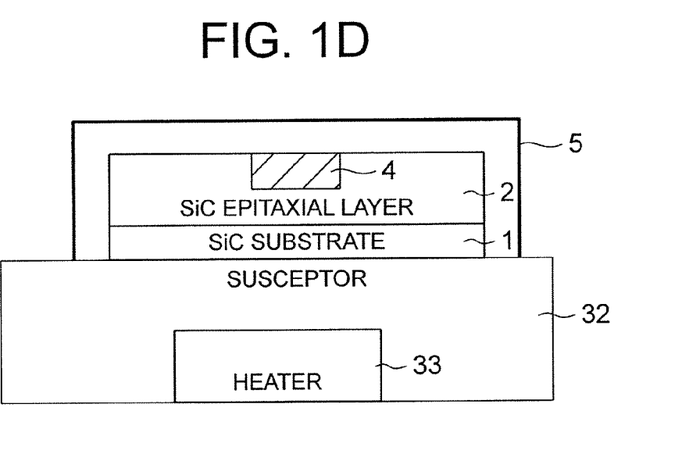
FIG. 1D shows an annealing heating apparatus using a cap.
Figure 1E:
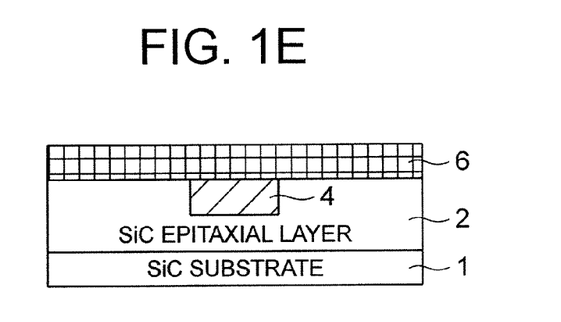
FIG. 1E shows annealing in which a cap layer is added.
Figure 1F:
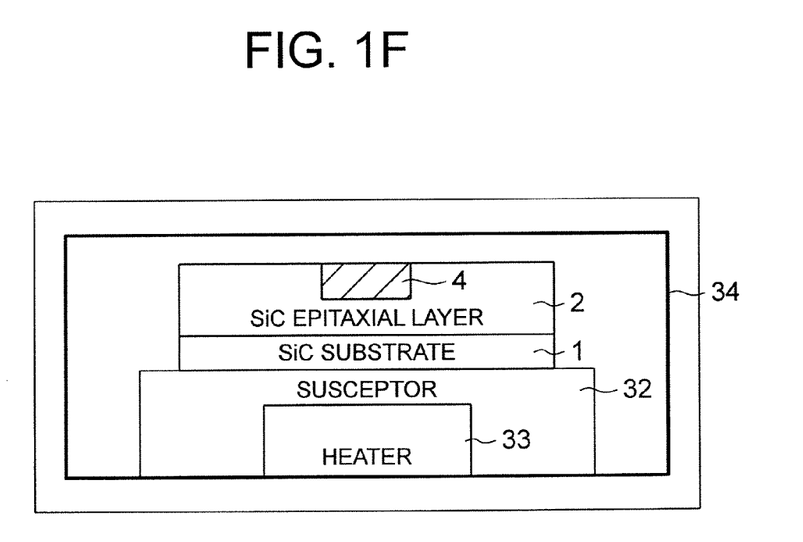
FIG. 1F shows an annealing heating apparatus using $SiH_4$ addition and a vessel of silicon carbide.
Figure 4:
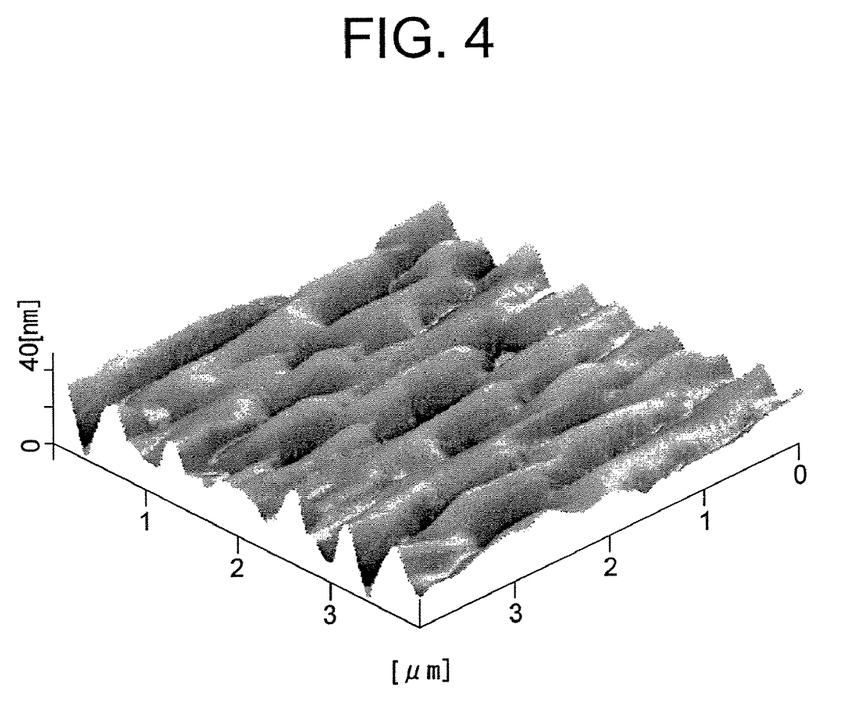
FIG. 4 shows surface irregularity on a silicon carbide (SiC) substrate generated from annealing.

Next, after removal of the mask, because the impurities implanted, as they are, are electrically inactive, annealing for activation is carried out using the heat treatment apparatus as shown in FIG. 3 to activate (FIG. 1C). Generally, for activating a p-type impurity in silicon carbide (SiC), compared to activation of an n-type impurity, it is necessary to anneal at a higher temperature, and (1) surface irregularity called the "step bunching" on a surface of silicon carbide (SiC), as shown in FIG. 4, was generated thereby. To prevent it, in a conventional art, in annealing, as shown in FIG. 1D (see WO 2006/043530), after a substrate surface of the SiC substrate on the substrate support of the susceptor 32 in the heat treatment apparatus is covered with a cap, annealing is sometimes performed. (2) Alternatively, as another way, as shown in FIG. 1E, a cap layer 6 of a carbonized film (Materials Science Forum Vols. 483-485 (2005) pp. 599-604, Y. Negoro, T. Kimoto and H. Matsunami), an Si film or an AlN film (Journal of Applied Physics Vol. 86 (1999) pp. 746-751, Evan M. Handy, Muluri V. Rao, K. A. Jones, M. A. Derenge, P. H. Chi, R. D. Vispute, T. Venkatesan, N. A. Papanicolaou and J. Mittereder) is deposited on an epitaxial layer 3, and annealing is sometimes performed with the epitaxial layer 3 being covered. (3) Alternatively, as still another way, as shown in FIG. 1F, using addition of $SiH_4$ (MRS Spring (2004), S. Rao, S. E. Saddow, F. Bergamini, R. Nipoti, Y. Emirov and A. Agarwal) or a silicon carbide (SiC) vessel (Materials Science Forum Vols. 483-485 (2005) pp. 621-624, M. Rambach, A. J. Bauer, L. Frey, P. Friedrichs and H. Ryssel), annealing is sometimes performed.

However, the aforementioned annealing method for activating the implanted impurities into the silicon carbide (SiC) substrate has a problem described below. The method in that the cap layer 6 of the carbonized film, the Si film, the AlN film or the like as shown in FIG. 1E is deposited on the surface of the silicon carbide (SiC) substrate has been proposed, but it increases the number of steps before and after, leading to an increase in a manufacturing cost. It was reported that, as shown in FIG. 1F, usage of the $SiH_4$ addition or the silicon carbide (SiC) vessel 34 (FIG. 1F) controls the surface irregularity, but a problem of repeatability or controllability has arisen. Further, for an internal part in an annealing apparatus, a part which suppresses emission of a discharge gas is used, and in a vacuum, annealing is carried out, and whereby, possibility for controlling the surface irregularity has been found out, but, only under a reduced pressure condition, it is not sufficient in repeatability etc., dependent on implantation species or implantation conditions.

The present inventors found out that, by evacuating the vacuum vessel in the end station 20 shown in FIG. 2 of air so that a pressure in the vacuum vessel is not greater than $10^{-5}$ Pa, setting a partial pressure of residual $H_2O$ in the vacuum vessel to be not greater than $10^{-2}$ Pa, and annealing (for example, at 1800° C.) under this condition, the surface flatness (RMS value) reached about 2 nm, which was considerably lower than 6 nm. Further, by setting the partial pressure of residual $H_2O$ in the vacuum vessel to be not greater than $10^{-3}$ Pa and annealing (for example, 1800° C.) under this condition, activation ratio was about 80% and the RMS value was 0.8 nm, and so we achieved a high, electric activation while maintaining the surface flatness (RMS value) to be not greater than 1 nm. That is, it was found out that, under an atmosphere in which $H_2O$ is reduced as much as possible, if the high, electric activation is provided at a higher temperature, the surface flatness can be maintained. In addition, the "activation ratio" used herein is a ratio indicating how many carriers (electrons and holes) the implanted impurities create. Further, in this embodiment, an example in which annealing is performed at 1800° C. is described, but the annealing also may be done at in the range of 1500° C. to 2200° C. It is thought that, in the annealing at a temperature higher than 1500° C., the surface is etched in the etching reaction of $2H_2O+SiC \Rightarrow SiO\uparrow+CO\uparrow+2H_2\uparrow$, and even if a high purity Ar gas of 5N is used in an Ar atmosphere, the partial pressure of $H_2O$ is about 1 Pa, so that reaction probability as described above is higher by a factor of 1000, as a result, the surface is roughened.

Figure 5:
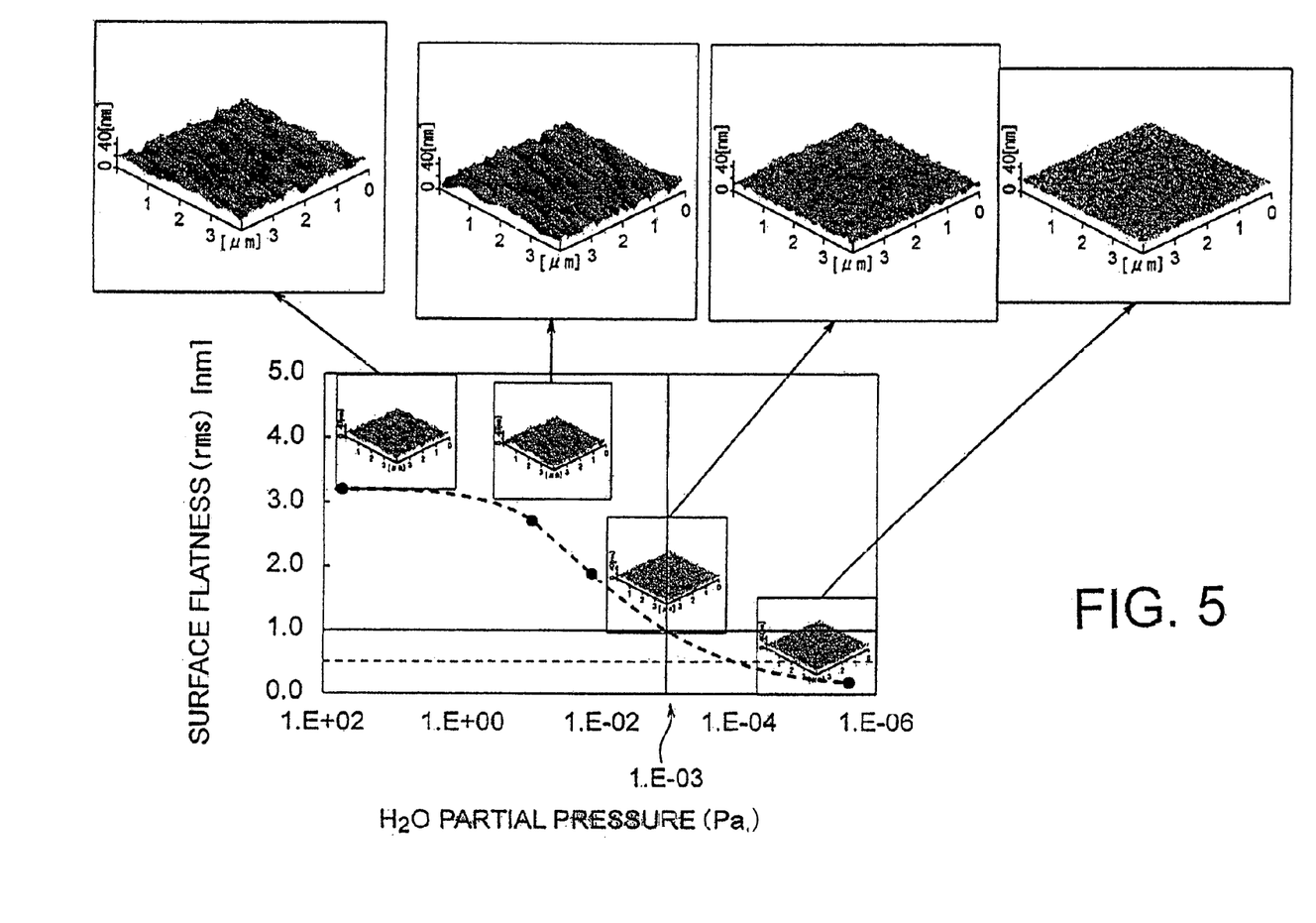
FIG. 5 is a graph illustrating relationship between a partial pressure of residual $H_2O$ and the surface irregularity of a silicon carbide (SiC) substrate.

FIG. 5 is a graph illustrating relationship between the partial pressure of residual $H_2O$ and the surface irregularity. It will be seen from the graph in FIG. 5 that, in the atmosphere with the partial pressure of $H_2O$ of about $10^{-2}$ Pa, the surface flatness is controlled to be 2 nm, and in the atmosphere with the partial pressure of $H_2O$ of about $10^{-3}$ Pa, the surface flatness is controlled to be 1 nm. In addition, it was found out that, also in the annealing in the atmosphere having the high purity Ar gas introduced therein or in the annealing in a reduced pressure, the surface irregularity was some improved, but the surface was etched due to reaction between the silicon carbide (SiC) substrate and residual moisture at a high temperature, and roughened, and therefore, the surface flatness (RMS value)<2 nm, or <1 nm was not achieved. In the present invention, the high, electric activation can be easily accomplished while maintaining the surface flatness (RMS value) to be equal to or less than 2 nm, and preferably equal to or less than 1 nm in the end, because, by providing an atmosphere having the partial pressure of residual $H_2O$ which is not greater than $10^{-2}$ Pa or $10^{-3}$ Pa, the reaction probability between the silicon carbide (SiC) and the residual moisture can be largely reduced even at a high temperature, and the etching reaction can be suppressed.

In addition, a specific measuring method of the surface flatness (RMS) performed in the present invention is as follows.

1. Measurement equipment: AFM (Atomic Force Microscopy)
   Name of the maker: SII (Seiko Instruments Inc.)
2. Type name: NPX200M0001
   Viewing head: NPX200
   Controller: Nanopics 2100
3. Measuring method
   Scanning in DFM (Damping Force Mode)
   (The mode in that a probe oscillating periodically at a constant amplitude is brought near a surface of a silicon carbide (SiC) substrate sample and a distance from a cantilever to the surface of the sample is controlled to keep the attenuation of the amplitude to be constant)
4. Measurement region: 4×4 µm².

Figure 6:
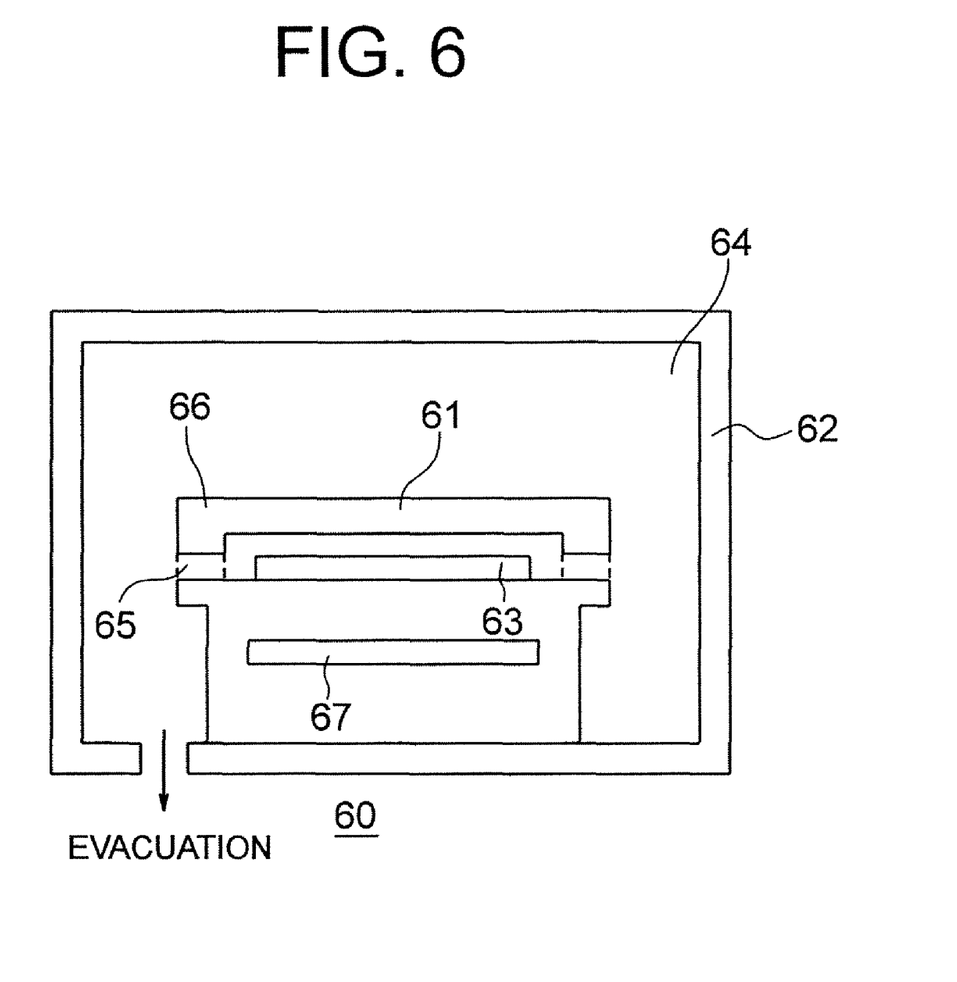
FIG. 6 is a cross-section view of a heating apparatus using a cap having a through-hole for annealing.

FIG. 6 is a cross-section view of another heat treatment apparatus 60 for implementing the annealing method of the present invention. FIGS. 7A to 7D are perspective views illustrating a covering body (cap) in FIG. 6. In the heat treatment apparatus shown in FIG. 6, differed from the heat treatment apparatus shown in FIG. 1D (see WO 2006/043530), a through-hole 65, an air vent communicating between a space 64 formed between the covering body (cap) 61 and a wall 62 of a heat treatment chamber, and a space 64 in the heat treatment chamber is formed in a peripheral wall 55 of the covering body (cap) 61, and whereby, the conductance in the vicinity of a silicon carbide (SiC) substrate 63 to be subject to a heat treatment by heating means is increased.

Therefore, in an atmosphere in which the partial pressure of residual $H_2O$ in the heat treatment chamber is controlled to be not greater than $10^{-2}$ Pa, and preferably not greater than $10^{-3}$ Pa, by evacuating with a vacuum pump the heat treatment chamber shown in FIG. 6 of air so that a pressure in the heat treatment chamber is not greater than $10^{-5}$ Pa, a silicon carbide (SiC) substrate 63 can be more uniformly heated because of the covering body (cap) having such through-hole 65, achieving sufficient activation.

Figure 7A:
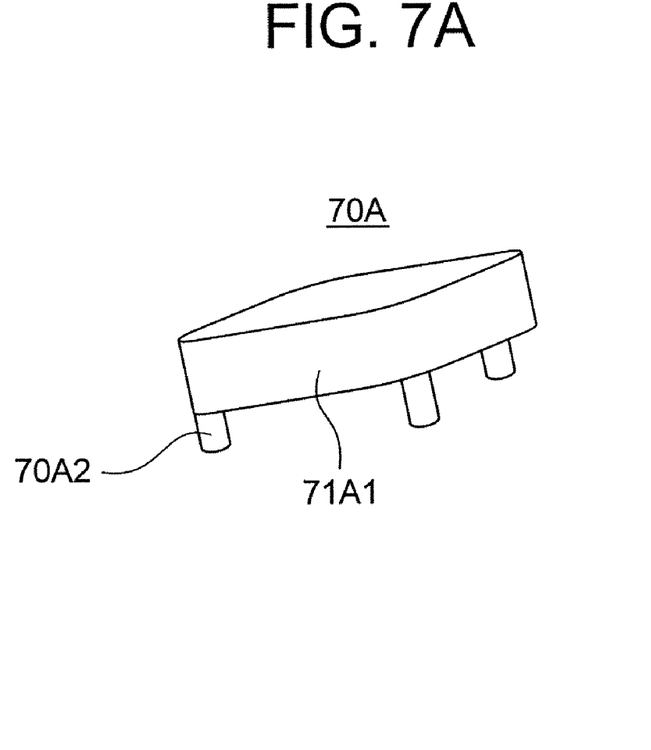
FIG. 7A shows a first example of a cap having a through-hole.
Figure 7B:
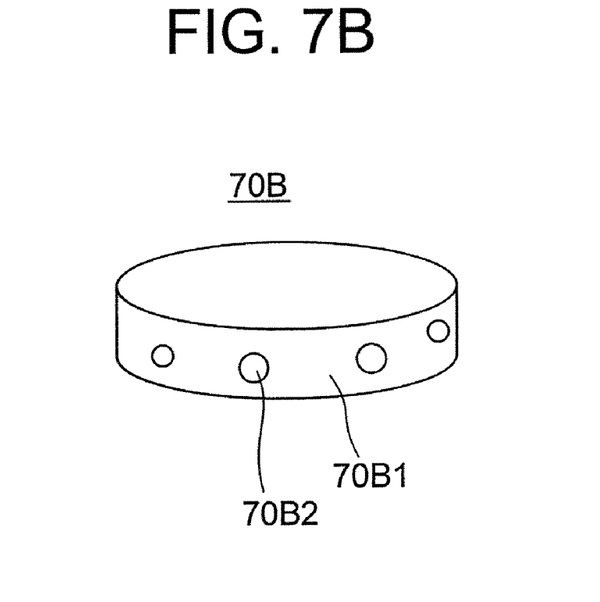
FIG. 7B shows a second example of a cap having a through-hole.
Figure 7C:
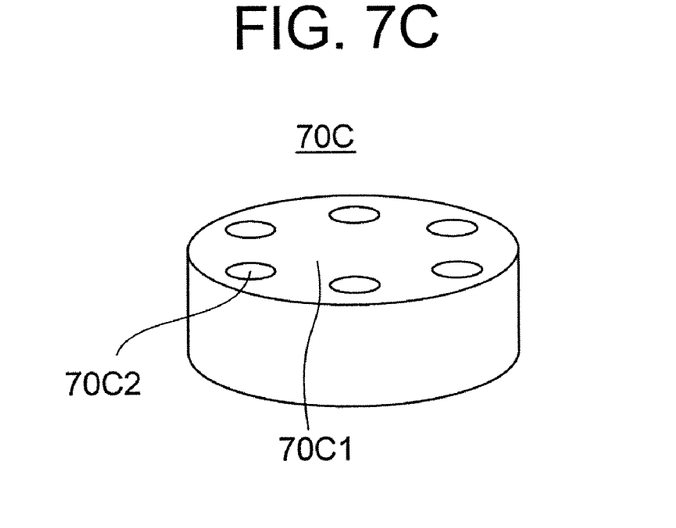
FIG. 7C shows a third example of a cap having a through-hole.
Figure 7D:
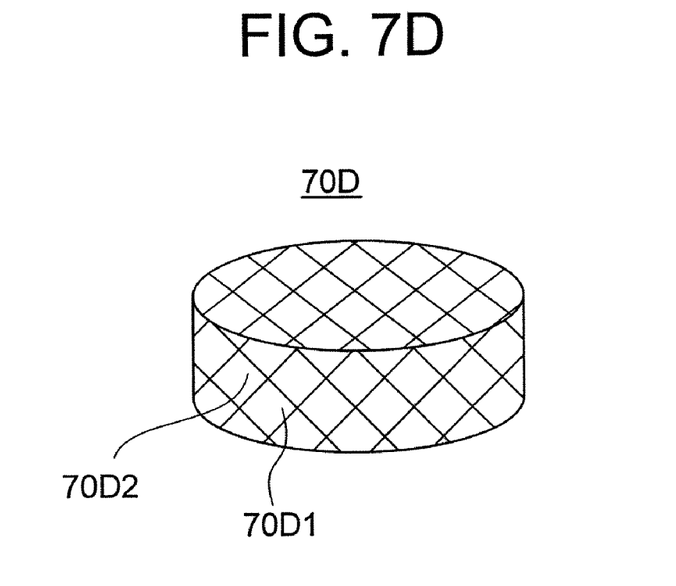
FIG. 7D shows a fourth example of a cap having a through-hole.

A cap 70A in FIG. 7A includes a leg 70A2 under a cylindrical, peripheral wall of the cap 70A, and a through-hole is formed between the legs. A cap 70B in FIG. 7B includes a hole 70B2 drilled in a cylindrical, peripheral wall 70B1 of the cap, and the hole 70B2 forms a through-hole. A cap 70C in FIG. 7C includes a hole 70C2 drilled in a cylindrical top plate 70C1, and the hole 70C2 forms a through-hole. A cap 67 in FIG. 7D is cylindrically formed by a net 70D1, and a mesh of the net forms a through-hole. Next, referring to FIGS. 8A and 8B, an annealing method for annealing a well region 82 implanted with impurities of a silicon carbide (SiC) substrate 81 will be described.

Figure 8A:
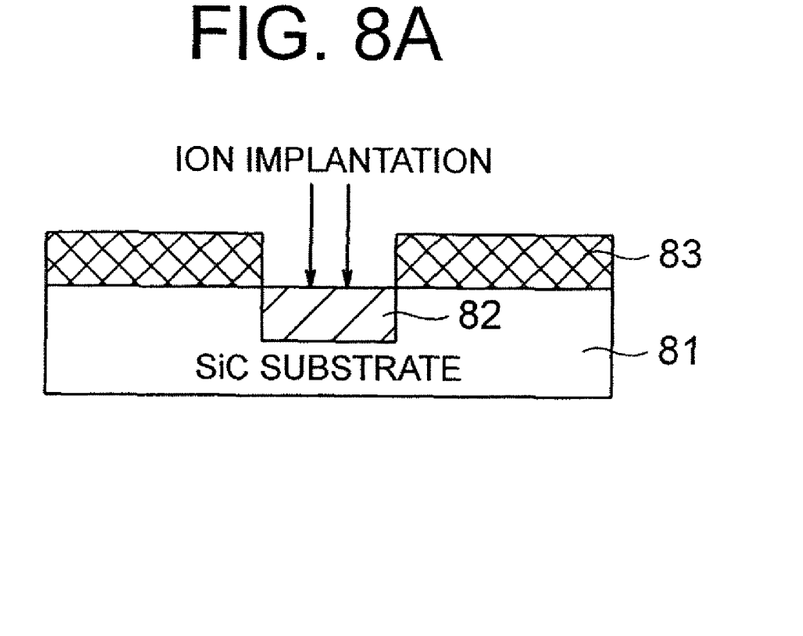
FIG. 8A shows impurity implantation into a silicon carbide (SiC) substrate.
Figure 8B:
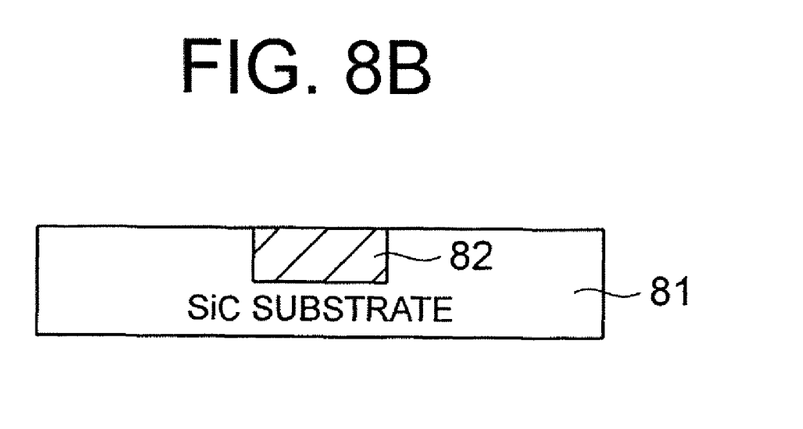
FIG. 8B shows annealing of the silicon carbide (SiC) substrate in FIG. 8A.

After the sacrifice oxidation and the hydrofluoric acid treatment, an $SiO_2$ film etc. is deposited on the silicon carbide (SiC) substrate 81, a mask 83 is formed by lithography and dry etching, and aluminum ions to be impurities are implanted using the ion implantation system shown in FIG. 2 etc. to selectively form the well region 82 in the silicon carbide (SiC) substrate 81 (see FIG. 8A). In addition, in this embodiment, for the impurities, TMA (tetramethyl aluminum) as a source is excited by plasma to extract Al ions to implant using the extraction electrode and the analyzer tube and the ion implantation is carried out, alternatively, aluminum as a source may be excited by plasma to extract aluminum ions to implant using the extraction electrode and the analyzer tube and the ion implantation also may be carried out. After removal of a mask, to activate the well region, annealing is carried out using the heat treatment apparatus as shown in FIG. 1D, FIG. 3 or FIG. 6 (see FIG. 8B). In addition, in this embodiment, the annealing is performed at 1800° C., but the annealing also may be done at in the range of 1500° C. to 2300° C.

Figure 9A:
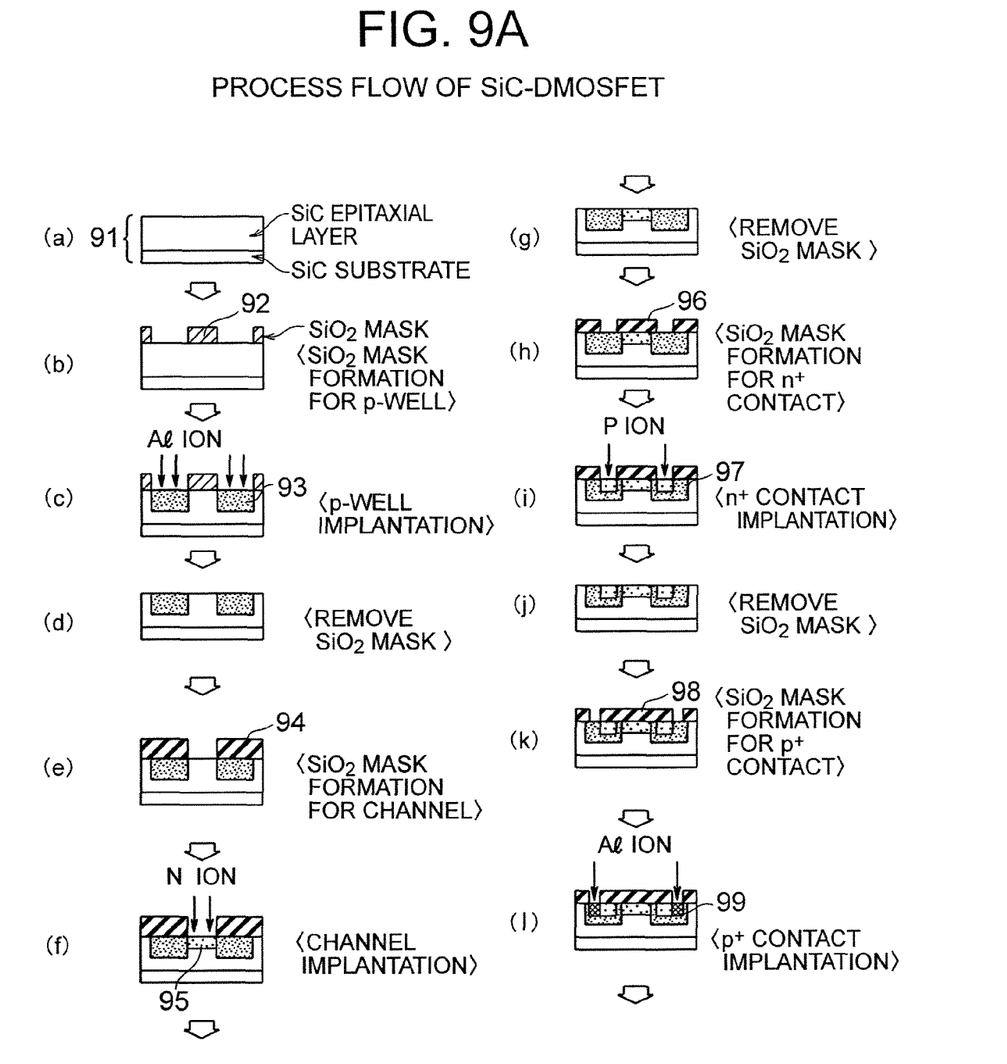
FIG. 9A and FIG. 9B show a process flow for manufacturing a silicon carbide (SiC)-DMOSFET.
Figure 9B:
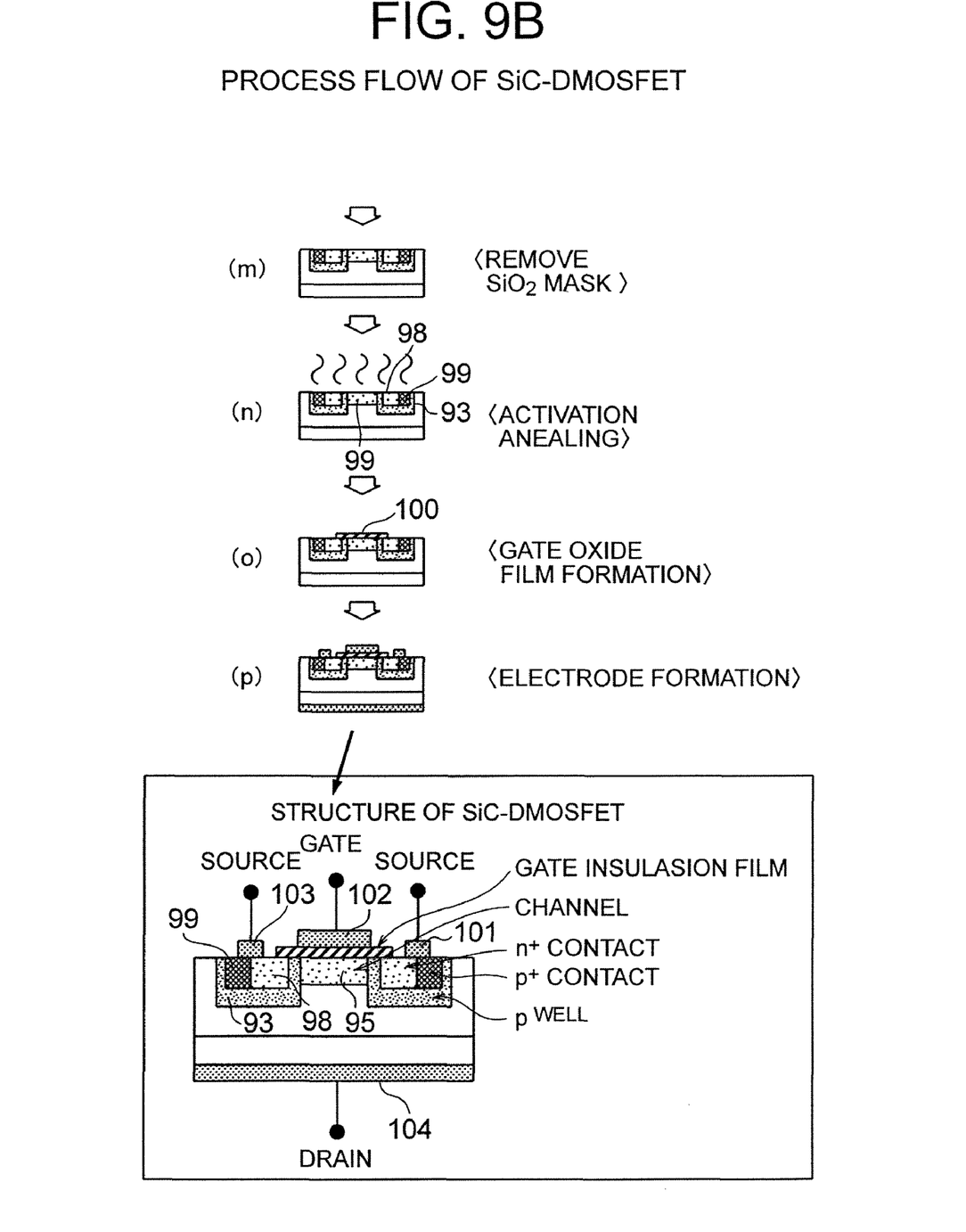

FIG. 9A and FIG. 9B show a process flow of steps (a) to (p) for manufacturing a silicon carbide (SiC)-DMOSFET according to the present invention. In step (a), an SiC substrate 91 having an SiC epitaxial layer formed thereon is provided. In step (b), a pattern of an $SiO_2$ mask 92 to form two p-type wells is formed. In step (c), Al ions are implanted into a p-type well 93. In step (d), the $SiO_2$ mask 92 is removed. In step (e), a pattern of an $SiO_2$ mask 94 for a channel to be exposed between the two p-type wells is formed. In step (f), N ions are implanted into the channel to form a channel 95. In step (g), the $SiO_2$ mask 94 for the channel is removed. In step (h), an $SiO_2$ mask 96 to form an $n^+$ contact, exposing a part of the p-type well is formed.

In step (i), P ions are implanted into a contact region 97 to form an $n^+$ contact 97. In step (j), the $SiO_2$ mask 96 for the $n^+$ contact is removed. In step (h), an $SiO_2$ mask 98 for a +p contact is formed to expose the $n^+$ contact region by the p-type well. In step (l), Al ions are implanted into a $p^+$ contact region 99 to form a $p^+$ contact 99. In step (m), the $SiO_2$ mask 98 for the +p contact is removed. In step (n), the impurity regions 93, 95, 97, 99 formed in the SiC epitaxial layer of the SiC substrate are annealed for activation in the atmosphere described above according to the present invention. In step (o), a gate oxide film 100 is formed on a surface of the SiC substrate after the annealing. With the annealing treatment according to the present invention, the gate oxide film does not lose reliability, and the channel mobility is prevented from being lowered while achieving a higher flatness on the surface. Finally, in step (p), a source electrode 101, a gate electrode 102, a source electrode 103 and a drain electrode 104 are formed and a structure of the SiC-DMOSFET is completed.

In addition, the "dose amount" used herein means an amount of addition of impurities implanted into a semiconductor substrate through the ion implantation, and it is determined by the ion beam energy and the time period of irradiation of the ion beam. By applying the process flow to formation of the $n^+$ contact region implanted with phosphorus (P) or nitrogen (N) and the channel region, besides formation of the p-type well region and the $p^+$ contact region, a silicon carbide (SiC) MOSFET as shown in FIG. 9 can be manufactured. Also, when the RMS value reaches 0.6 nm, the problems, including reliability of a gate oxide film in a MOSFET is lowered, the channel mobility is reduced, or a leakage electric current in a p-n junction is increased, do not occur.

What is claimed is:

1. An annealing method for annealing a device including a silicon carbide substrate, the method comprising steps of:
    forming an impurity doped region in the silicon carbide substrate by ion-implantation of the impurity into the silicon carbide substrate; and
    annealing the impurity doped region in the silicon carbide substrate in an atmosphere in which a partial pressure of residual $H_2O$ in a heat treatment chamber is not greater than $10^{-2}$ Pa by evacuating the heat treatment chamber so that a pressure in the heat treatment chamber is not greater than $10^{-5}$ Pa,
    wherein, during the annealing step, the silicon carbide substrate implanted with the impurity is covered by a cap having a through-hole,
    wherein the through-hole is an air vent communicating between a space in the heat treatment chamber and a space formed between the cap and the heat treatment chamber, and
    wherein the through-hole is formed in the cap.

2. The annealing method according to claim 1, wherein the through-hole is formed in a peripheral wall of the cap.

3. The annealing method according to claim 1, wherein the cap includes legs under a cylindrical, peripheral wall of the cap, and the hole forms the through-hole.

4. The annealing method according to claim 1, wherein the cap includes a hole drilled in a cylindrical, peripheral wall of the cap, and the hole forms the through-hole.

5. The annealing method according to claim 1, wherein the cap includes a hole drilled in a cylindrical, top plate of the cap, and the hold forms the through-hole.

6. The annealing method according to claim 1, wherein the cap is cylindrically formed by a net and a mesh of the net forms the through-hole.

* * * * *